(12) United States Patent
Dasgupta et al.

(10) Patent No.: US 9,847,432 B2
(45) Date of Patent: Dec. 19, 2017

(54) FORMING III-V DEVICE STRUCTURES ON (111) PLANES OF SILICON FINS

(71) Applicant: INTEL CORPORATION, Santa Clara, CA (US)

(72) Inventors: Sansaptak Dasgupta, Hillsboro, OR (US); Han Wui Then, Portland, OR (US); Sanaz Gardner, Hillsboro, OR (US); Benjamin Chu-Kung, Hillsboro, OR (US); Marko Radosavljevic, Beaverton, OR (US); Seung Hoon Sung, Beaverton, OR (US); Robert Chau, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/912,403

(22) PCT Filed: Sep. 25, 2013

(86) PCT No.: PCT/US2013/061647
§ 371 (c)(1),
(2) Date: Feb. 16, 2016

(87) PCT Pub. No.: WO2015/047244
PCT Pub. Date: Apr. 2, 2015

(65) Prior Publication Data
US 2016/0204276 A1  Jul. 14, 2016

(51) Int. Cl.
*H01L 29/66* (2006.01)
*H01L 29/78* (2006.01)
(Continued)

(52) U.S. Cl.
CPC ........ *H01L 29/78696* (2013.01); *B82Y 10/00* (2013.01); *H01L 21/0243* (2013.01);
(Continued)

(58) Field of Classification Search
CPC ........... H01L 21/0237; H01L 21/02439; H01L 21/02521; H01L 29/12; H01L 31/0256; H01L 33/26; H01L 21/0521
See application file for complete search history.

(56) References Cited

U.S. PATENT DOCUMENTS 8,362,575 B2 * 1/2013 Kwok ................... H01L 29/045
257/368
8,675,382 B2   3/2014 Kurokawa
(Continued)

FOREIGN PATENT DOCUMENTS

TW    201248835 A    12/2012
TW    201338043 A     9/2013
(Continued)

OTHER PUBLICATIONS

Notification of Transmittal of the International Search Report and the Written Opinion of the International Searching Authority for PCT/US2013/061647 filed Sep. 25, 2013, dated May 28, 2014, 10 pages.
(Continued)

*Primary Examiner* — Benjamin Sandvik
*Assistant Examiner* — Damon Hillman
(74) *Attorney, Agent, or Firm* — Schwabe, Williamson & Wyatt P.C.

(57) ABSTRACT

Methods of forming high voltage (111) silicon nano-structures are described. Those methods and structures may include forming a III-V device layer on (111) surface of a silicon fin structure, forming a 2DEG inducing polarization layer on the III-V device layer, forming a source/drain material on a portion of the III-V device layer on terminal ends of the silicon fin. A middle portion of the silicon fin structure between the source and drain regions may be removed, and backfilled with a dielectric material, and then
(Continued)

a gate dielectric and a gate material may be formed on the III-V device layer.

25 Claims, 8 Drawing Sheets

(51) Int. Cl.
  *H01L 29/04*   (2006.01)
  *H01L 29/786*  (2006.01)
  *H01L 29/778*  (2006.01)
  *H01L 27/108*  (2006.01)
  *H01L 29/423*  (2006.01)
  *H01L 29/49*   (2006.01)
  *H01L 29/51*   (2006.01)
  *H01L 29/06*   (2006.01)
  *H01L 21/02*   (2006.01)
  *B82Y 10/00*   (2011.01)
  *H01L 29/775*  (2006.01)
  *H01L 29/41*   (2006.01)
  *H01L 29/20*   (2006.01)

(52) U.S. Cl.
  CPC ...... *H01L 21/0245* (2013.01); *H01L 21/0254* (2013.01); *H01L 21/02381* (2013.01); *H01L 21/02433* (2013.01); *H01L 21/02494* (2013.01); *H01L 21/02516* (2013.01); *H01L 27/10826* (2013.01); *H01L 27/10879* (2013.01); *H01L 29/045* (2013.01); *H01L 29/0657* (2013.01); *H01L 29/0673* (2013.01); *H01L 29/0676* (2013.01); *H01L 29/413* (2013.01); *H01L 29/42392* (2013.01); *H01L 29/4908* (2013.01); *H01L 29/517* (2013.01); *H01L 29/66462* (2013.01); *H01L 29/66742* (2013.01); *H01L 29/775* (2013.01); *H01L 29/7786* (2013.01); *H01L 29/785* (2013.01); *H01L 29/78618* (2013.01); *H01L 29/78681* (2013.01); *H01L 29/2003* (2013.01)

(56) References Cited

U.S. PATENT DOCUMENTS

| 8,841,701 | B2* | 9/2014 | Lin ..................... H01L 29/7853 |
| | | | 257/192 |
| 8,878,362 | B2 | 11/2014 | Cheng |
| 2007/0231984 | A1 | 10/2007 | Metz et al. |
| 2009/0085027 | A1 | 4/2009 | Jin et al. |
| 2010/0081278 | A1 | 4/2010 | Hussain et al. |
| 2010/0252862 | A1 | 10/2010 | Ko et al. |
| 2012/0193677 | A1 | 8/2012 | Parikh et al. |
| 2013/0049068 | A1 | 2/2013 | Lin et al. |
| 2013/0062699 | A1 | 3/2013 | Zhu et al. |
| 2016/0300932 | A1* | 10/2016 | Choi ................. H01L 29/66795 |

FOREIGN PATENT DOCUMENTS

| WO | WO 2013-095346 A1 | 6/2013 |
| WO | WO 2013-095651 A1 | 6/2013 |

OTHER PUBLICATIONS

Allowance Decision of Examination from the Taiwan Intellectual Property Office dated Jan. 6, 2016 and Search Report (English Translation) for Taiwan Patent Application No. 103132434.

Office Action including Search Report (7 pages) dated Feb. 23, 2017 issued by the Examiner of the Intellectual Property Office (the IPO) for Taiwan Patent Application No. 105104293 and English Translation (5 pages) thereof.

European Extended Search Report for EP Application No. 13 89 4791.6 dated Apr. 18, 2017, 10 pages.

Kuryatkov, et al.,"GaN stripes on vertical {111} fin facets of (110)-oriented Si substrates," Applied Physics Letters, AIP Publishing LLC, US, vol. 96, No. 7, XP012132247, Feb. 16, 2010, 3 pages.

* cited by examiner

FORMING III-V DEVICE STRUCTURES ON (111) PLANES OF SILICON FINS

This patent application is a U.S. National Phase Application under 35 U.S.C. 371 of International Application No. PCT/US2013/061647 filed Sep. 25, 2013

BACKGROUND OF THE INVENTION

Integration of III-V materials, such as gallium nitride, onto (100) silicon surfaces (100) is highly desired for such applications as) high voltage and RF devices for System on chip (SoC) technology, as well as for complementary metal oxide silicon (CMOS) applications. This integration involves fabrication challenges that may arise due to the mismatch in lattice properties between the two materials. This lattice mismatch, which may be near forty two percent, may cause epitaxial growth of low defect density III-V materials to become prohibitive. Additionally, the large thermal mismatch between gallium nitride and silicon (which is about one hundred and sixteen percent) coupled with conventional high growth temperatures for gallium nitride, can result in the formation of surface cracks on epitaxial layers, thus inhibiting the use of III-V materials on Si (100) for device fabrication.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
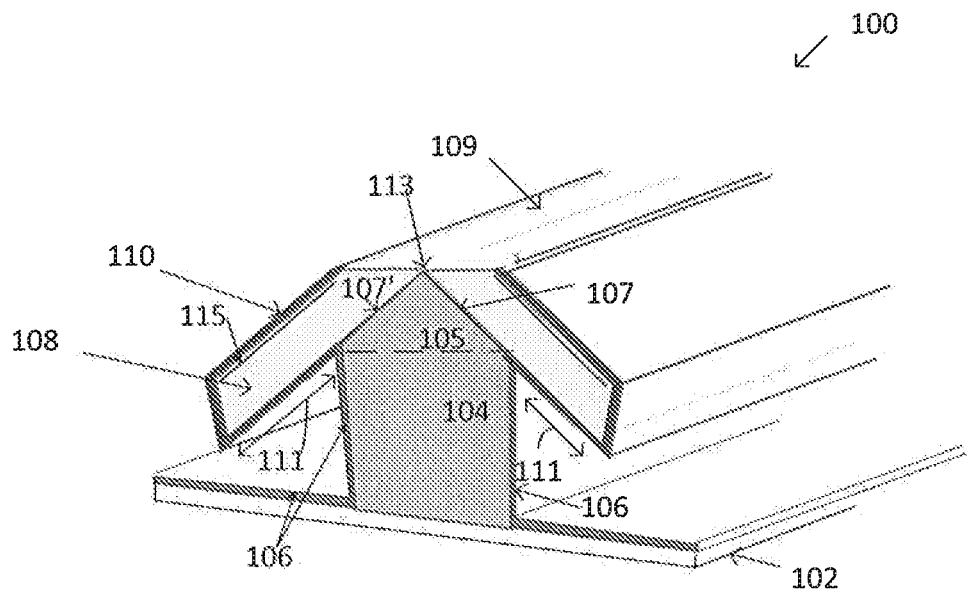
FIGS. 1a-1h represent cross-sectional views of structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as high voltage transistors formed on (111) silicon planes of silicon nanostructures, are described. Those methods/structures may include forming a III-V device layer on (111) surface of a silicon fin structure, forming a polarizing inducing layer on the III-V device layer, and forming a III-V based source/drain material on the III-V device layer, wherein the III-V based source/drain material forms on terminal ends of the silicon fin. A middle portion of the silicon fin structure between the source and drain regions may be removed, and a gate dielectric and a gate material may be wrapped around on the III-V device layer in a gate region. The (111) silicon nanofin structures of the various embodiments disclosed herein enable high voltage SoC applications such as and RF power and power management integrated circuit (PMIC) applications.

FIGS. 1a-1h illustrate cross-sectional views of embodiments of forming microelectronic structures, such as silicon nano-fin structures comprising (111) silicon planes. In an embodiment, a device structure 100, which may comprise a portion of a multi-gate structure such as a FINFET, a tri-gate, and a nanowire/nano-ribbon structure, may comprise a substrate 102 (FIG. 1a). The substrate 102 may comprise a silicon substrate having a (100) crystallographic plane. In an embodiment, the substrate 102 may comprise a (100) silicon wafer. The silicon substrate 102 may further comprise circuit elements, such as transistors and passive elements, for example. In an embodiment, the substrate 102 may comprise a portion of a CMOS substrate/wafer 102.

In an embodiment, the substrate 102 may comprise a monocrystalline silicon, germanium, silicon germanium, and III-V materials such as gallium arsenide. In an embodiment the substrate 102 may comprise a portion of a silicon on insulator (SOI) substrate. The device 100 may further comprise a silicon fin 104. In an embodiment, the silicon fin 104 may comprise a top portion 105. In an embodiment, the top portion 105 of the silicon fin 104 may comprise an apex 113. The top portion 105 of the silicon fin 104 may comprise (111) silicon crystallographic planes 107, 107'. In an embodiment, the silicon fin 104 may be doped with a p type material, such as boron for example. The p type doping of the silicon fin 104 may serve to reduce leakage currents that may flow when a device according to the embodiments herein, such as a trigate transistor device and/or a nanowire/ nanoribbon transistor device, may be switched off.

In an embodiment, a thin spacer layer 106, which may comprise a dielectric material such as silicon dioxide and/or silicon oxynitride material, may be formed on the silicon (110) and/or silicon (100) sidewalls of the nanofin 104, and may also be formed on a surface of the substrate 102. The spacer material 106 serves to prevent the growth of a III-V epitaxial material in a subsequent process step on the (100) silicon substrate and on silicon (110) sidewalls of the fin 104. In an embodiment, the spacer 106 may allow area for the growth of a III-V device layer on the silicon (111) planes. In an embodiment, a III-N nucleation layer (not shown) may optionally be formed on the silicon (111) sides 107, 107' of the fin 104. The III-N nucleation layer may comprise aluminum nitride, in an embodiment.

In an embodiment, a III-V device layer 108 may be formed on the silicon (111) planes of the top portion 105 of the silicon fin 104, wherein the III portion may comprise any of the group III elements from the periodic chart, and the V portion may comprise elements from group V of the periodic chart, such as nitride, for example. In an embodiment, the III-V device layer may comprise a GaN/InGaN material 108, and may comprise a transistor channel structure 108. The III-V device layer 108 may comprise a thickness of between about 1 nm to about 100 nm.

The III-V device layer 108 may be grown utilizing epitaxial growth. The epitaxial growth may comprise lateral epitaxial growth, and may form an overhang region 111 that may be disposed away from the silicon fin 104 and in a downward direction towards the substrate 102. The amount of overgrowth away from the silicon fin 104 can be tuned by adjusting a starting height of the silicon fin 104. The III-V device layer 108 only grows from the silicon (111) plane, and is laterally overgrown, wherein the laterally overgrown III-V device layer 108 is substantially defect free. For example, for gallium nitride (GaN) growing out of the silicon (111) planes, defects in the GaN usually propagate parallel to the (0001) direction in the GaN (hence perpendicular to the silicon fin (111) plane 107. As such, all the defects propagate vertically but for laterally overgrown GaN, the defects do not bend and hence the overhanging part has reduced defect densities. This is partly due to the material property of the GaN and III-N material system specifically, where the dislocations tend to orient themselves in the (0001) axis and hence laterally grown material results in low defect densities. After growth of the III-V device layer 108, a top portion 109 of the III-V device layer 108 is planarized. In an embodiment, the III-V device layer 108 may comprise a two dimensional electron gas (2DEG) 115 region/layer.

In an embodiment, a polarization layer 110 may be formed on the III-V device layer 108. In an embodiment, the polarization layer 110 may comprise a III-V material, such as a AlGaN/AlInN layer, and may comprise a thickness of about 3 to about 20 nm, but may vary depending upon device design requirements. The polarization layer 110 may induce the 2DEG in the III-V device layer 108. In an embodiment the 2DEG may be induced on a top surface (c-plane) of the growing crystal structure of the III-V device layer 108. In an embodiment, the device 100 comprises a large Z height per footprint, which results in high currents that are useful in applications for SoC such as PMIC and RF-power amplifiers. In an embodiment, a top portion 109 of the polarization layer 110 may be polished and planarized. A portion of the III-V device layer 108 disposed at terminal ends of the silicon fin 104, may remain exposed after the formation of the polarization layer 110.

Figure 1B:
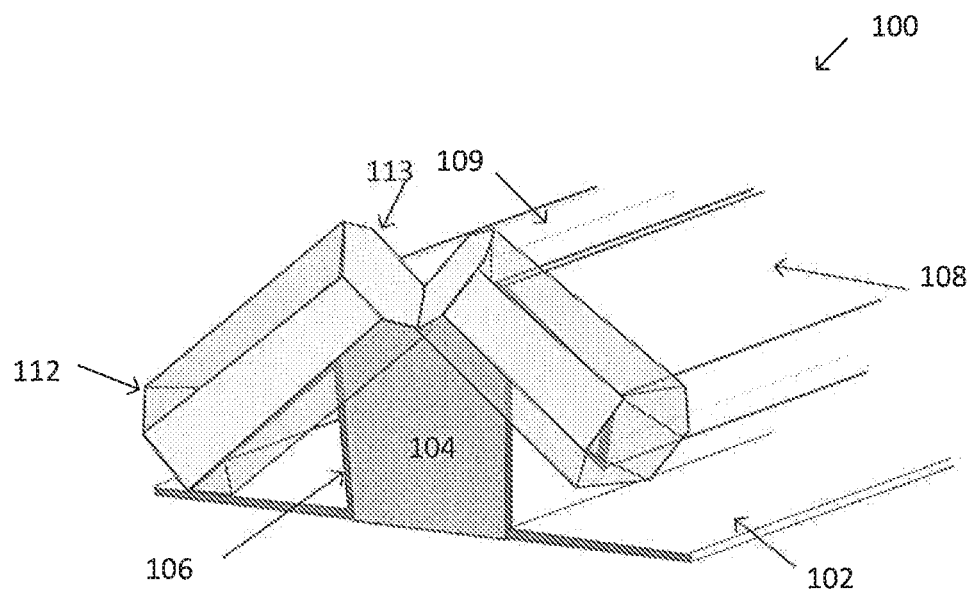

In an embodiment, a source/drain material 112 may be grown on the exposed portion of the device layer 108 disposed at terminal ends of the silicon fin 104 (FIG. 1*b*). In an embodiment, the source/drain material 112 may comprise an n+ III-V material, wherein the type dopant may comprise phosphorus or silicon, for example. In an embodiment, the source/drain material 112 may comprise an InGaN/GaN III-V material 112. In an embodiment, the source/drain 112 material may not be formed in a middle portion of the silicon fin 104. In an embodiment, the source/drain material 112 may grow on the exposed silicon (111) portion of the silicon fin 104, and may comprise a hexagonal crystallographic plane structure 113. In an embodiment, the source/drain material 112 may grow along the direction 111 of the silicon fin (see FIG. 1*a*), which is generally in a downwards direction towards the substrate 102.

Figure 1C:
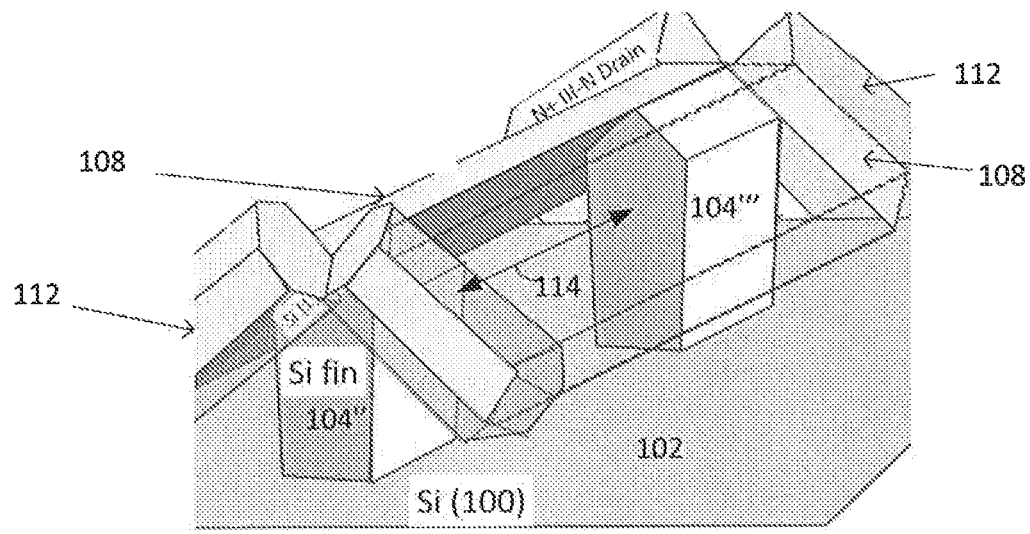

In an embodiment, a middle portion of the silicon fin 104 between the source/drain material 112 may be removed to form a gap 114, by using an etch process, such as a wet etch process for example (FIG. 1*c*). This prevents high electric fields in high voltage device applications from penetrating into the underlying silicon fin 104. Thus, premature device breakdown can be avoided due to silicon breakdown, by removing this portion 114 of the fin 104. In this manner, the breakdown voltage of a transistor/device of the embodiments herein is determined by the III-V device layer/channel properties itself, and not by the underlying silicon fin 114, which is removed herein.

The gap 114, which may be disposed under the III-V device layer 108, may be formed by etching out the middle portion with a combination of a wet each and a dry etch, in an embodiment. In an embodiment, the gap 114 may generally be disposed underneath a gate region of the III-V device layer 108. In an embodiment, a portion of the silicon fin 104 may remain under the source/drain material/structures 112, in order to support the III-V device layer 108 in those areas. In an embodiment, the void/gap 114 may be refilled with a dielectric material. In an embodiment, a high band gap, low k dielectric material may be used to back fill the void 114 region. In an embodiment, after the middle portion of the silicon fin is etched and the oxide has been backfilled into the gap 114, the silicon fin may comprise a first portion 104" disposed under the source region and a second portion 104''' disposed under the drain portion. The dielectric layer may be disposed between the first and second portions, wherein no silicon is disposed between the first and second portions 104", 104''' of the silicon fin.

Figure 1D:
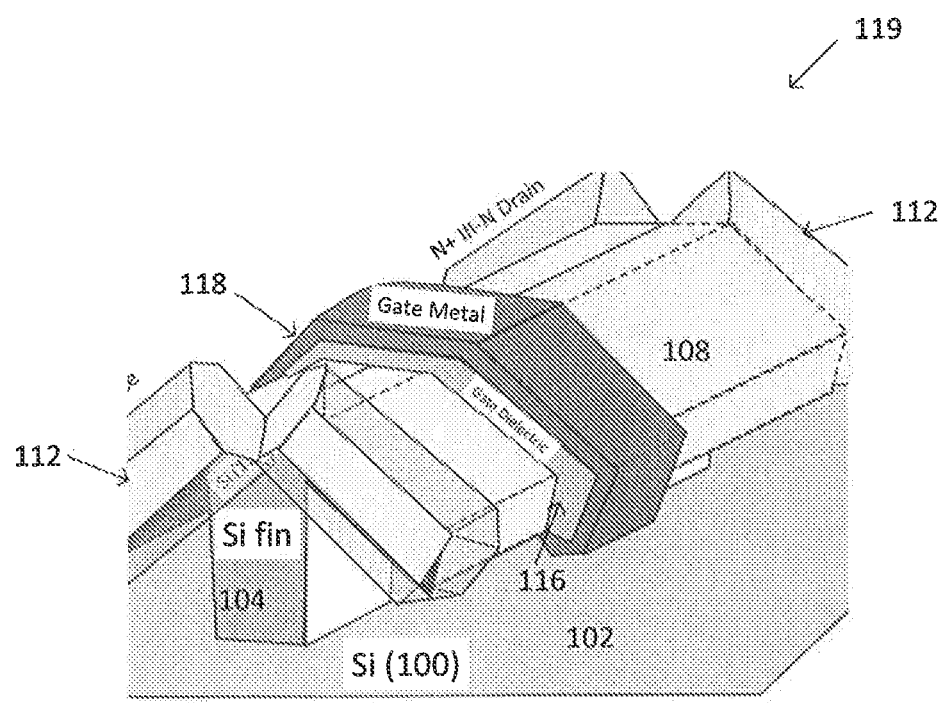

In an embodiment, a gate dielectric material 116, which may comprise: a high k dielectric gate material 116 in some cases, may be formed on the III-V device layer/channel 108 (FIG. 1*d*). In an embodiment, the gate dielectric material 116 may be formed by atomic layer deposition (ALD). A gate electrode 118 may be formed on the gate dielectric material 116 to form a high voltage device structure 119. High voltage applications are enabled by the high voltage transistor/device structure 119. The high voltage device structure 119 may comprise one of a multi-gate, nanowire, nanoribbon, FINFET and other such multi-gate transistor structures, in an embodiment.

In an embodiment, the gate dielectric material 116 and the gate electrode material 118 may be formed around the overhang regions of the epitaxially grown III-V device layer 108. In an embodiment, the gate dielectric and gate metal may be formed using ALD and PVD/ALD processes respectively. In an embodiment, the gate dielectric material 116 may comprise at least one of a hafnium oxide, aluminum oxide, and other such hi k dielectric materials. In an embodiment, the gate electrode 118 material may comprise such materials as nickel, platinum, titanium nitride.

Figure 1E:
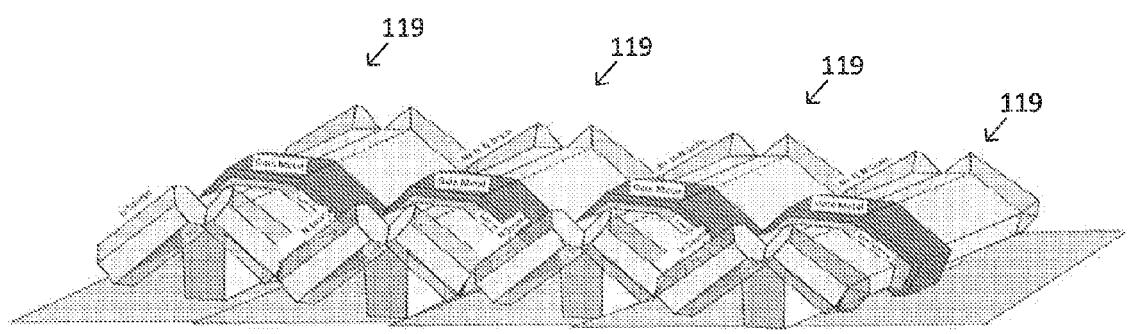
Figure 1F:
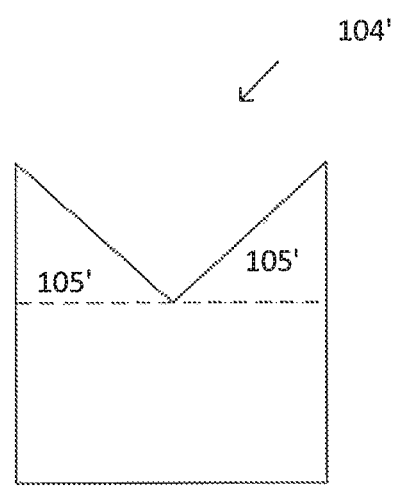
Figure 1G:
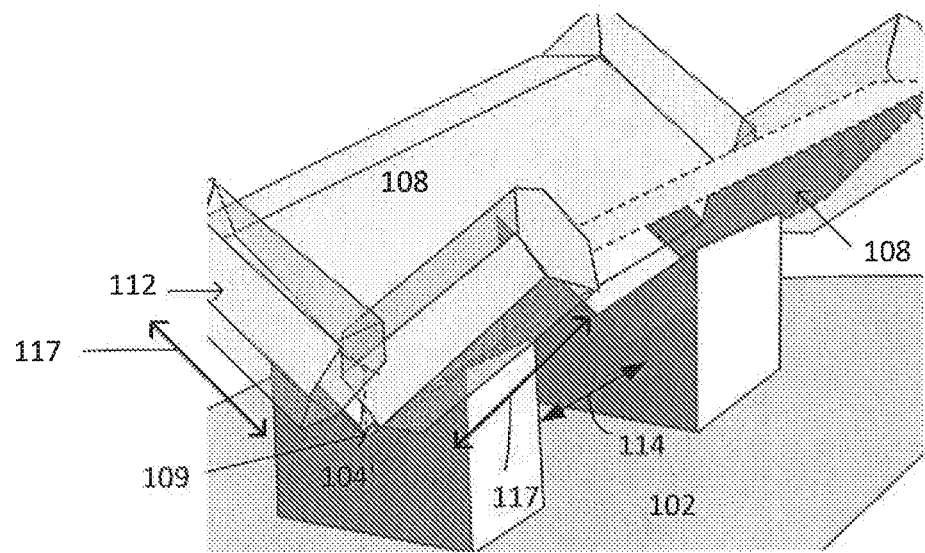
Figure 1H:
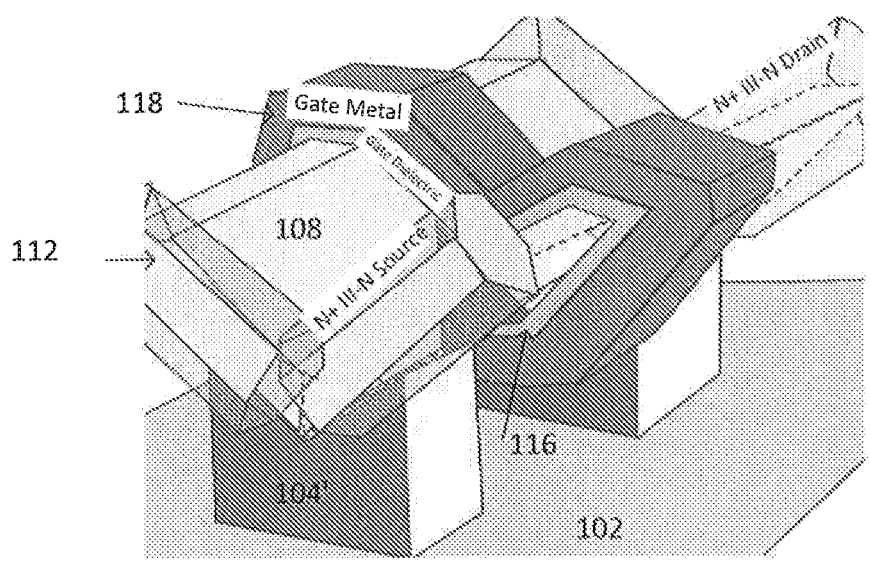

In an embodiment, rows//arrays of the devices 119 may be provided on a substrate 102, and may be stacked next to each other to provide a total Z required for system on chip (SoC) applications and for example (FIG. 1*e*). In another embodiment depicted in FIG. 1*f*, the silicon fin 104' may comprise two upper portions 105, 105' that are directed upwards, away from the substrate 102, wherein the nanofin 104' comprises an M structure (as compared with the V structure of the silicon fin of FIG. 1*a*, for example). In an embodiment, the III-V device layer 108, which may comprise a GaN channel 108, may be formed along both the portions 105, 105' of the (111) planes of the silicon fin 104' (FIG. 1*g*). In this embodiment, the source drain regions 112 that may be formed along the GaN channel 108 may form in an upward direction 117, away from the substrate 102. A gap 114 may be formed in a portion of the silicon nanofin 104' between the source and drain regions 112. The gap 114 may then be filled with a dielectric layer (not shown). The gate dielectric 116 and gate electrode 118 may then be formed on the III-V device layer 108, above the gap region 114 on a gate region of the III-V device layer 108 (FIG. 1h).

Figure 4:
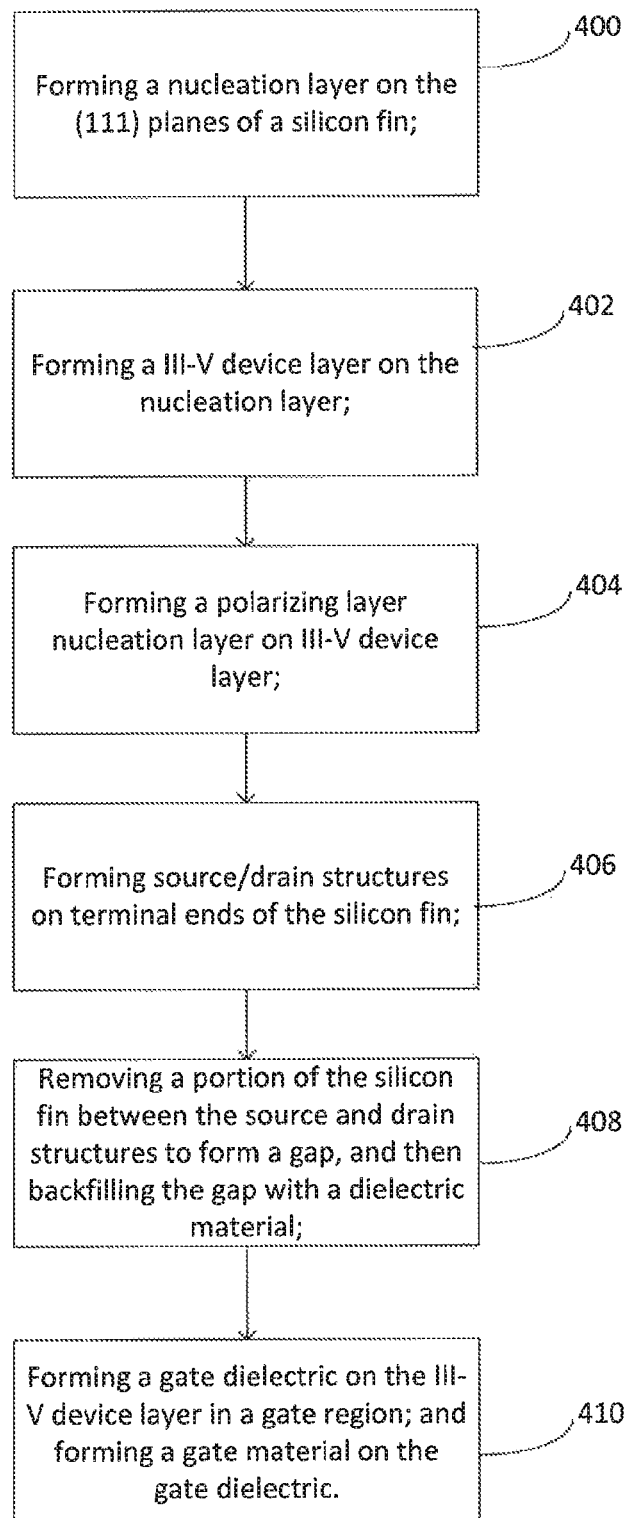
FIG. 4 represents a flow chart according to embodiments.

Turning to FIG. 4, a flow chart of a method of forming high voltage transistor devices formed on nano silicon fin structures is depicted, according to an embodiment. At step 400, a nucleation layer may be formed on the (111) planes of a silicon fin. At step 402, a III-V device layer may be formed on the nucleation layer. The III-V device layer may comprise a GaN device/channel layer, in an embodiment. At step 404, a polarizing layer may be formed on the III-V device layer. At step 406, source/drain structures may be formed on terminal ends of the silicon fin. The source/drain structures may comprise a hexagonal plane structure. At step 408, a portion of the silicon fin between the source and drain structures may be removed to form a gap, and the gap may then be backfilled with a dielectric material. At step 410, a gate dielectric may be formed on the III-V device layer in a gate region, and a gate material may be formed on the gate dielectric.

The devices herein may comprise portions of circuitry elements that may comprise logic circuitry for use in a processor die, for example. Metallization layers and insulator material may be included in the devices herein, as well as conductive contacts/bumps that may couple metal layers/interconnects to external devices. In an embodiment, the bumps may comprise copper.

In an embodiment, the devices herein may be coupled with any suitable type of package structures capable of providing electrical communications between a microelectronic device, such as a die and a next-level component to which the package structures may be coupled (e.g., a circuit board). In another embodiment, the devices may be coupled with a package structure that may comprise any suitable type of package structures capable of providing electrical communication between a die and an upper integrated circuit (IC) package coupled with the device of the embodiments herein.

A devices herein may comprise portions of a silicon logic die or a memory die, for example, or any type of suitable microelectronic device/die. In some embodiments the devices herein may further comprise a plurality of dies, which may be stacked upon one another, depending upon the particular embodiment. In some cases the devices herein may be located/attached/embedded on either the front side, back side or on/in some combination of the front and back sides of a package structure. In an embodiment, the die(s) may be partially or fully embedded in a package structure of the embodiments.

The various embodiments of the nanostructures grown on (111) silicon templates enable high voltage device applications. Because the silicon nanofin 104 is a nanoscale size, the portion on which the III-V material grows is more compliant than blanket large area III-V material growth on Si wafers. This results in strain transfer into the nanoscale fins thereby reducing the onset of plastic relaxation in the epitaxially grown III-V layer. Additionally, because the silicon fin comprises a three dimensional nature, there is much free surface area available for the III-V material 108 to experience free surface relaxation. Unlike prior art transistor structures, thick buffer layers are not required for the formation of the III-V material 108, which produces faster growth, less cost and easier integration of the III-V material with devices, such as silicon system on chip (SoC) devices, for example. In prior art transistor structures, blanket growth of III-N on (100) silicon wafers is typically required. The embodiments herein enable the formation of virtually defect free III-V material 108 comprising little to no defects.

Because the mismatch between the lattice parameter of the exposed (111) surfaces of the silicon fin and the lattice parameter of the device layer is substantially reduced, embodiments described herein provide an advantage of not requiring the use of thick buffer layers. For example, GaN has lower lattice mismatch to (111) silicon (17%) as opposed to (100) silicon (100) (~40%).

Using a starting silicon (111) template on a Si (100) large area wafer which may comprise CMOS circuits enables co-integration of III-N transistors and CMOS. Silicon (111) planes employed herein possess unit cells which are hexagonal in symmetry, and hence aid in better crystal registry of the hexagonal III-V material, such as a GaN unit cell on top of the (111) silicon. This may not be the case for (100) silicon, wherein the unit cell possess a cubic (diamond lattice structure) symmetry, and thus orienting a hexagonal crystal (III-N material) on the cubic material may result in formation of multiple domains and hence defects.

Applications for the devices herein include SoC products that require direct battery high voltage switching such as DC to DC conversion in the output filter as well as in the drive circuitries. DC to DC convertors are required in power management IC's found in SOC circuits for smart phones, notebooks, tablets, and other electronic mobile devices. Base station wireless transmission networks, electric power conversion technology in power transmission networks, and electric vehicle technologies are enabled. The embodiments provide low defect density coupled with large scale silicon substrate implementation.

The embodiments also allow for the use of thermally and lattice mis-matched systems on a silicon substrate, leading to thinner epi and lower defect density in the epi film. Nanostructures with silicon (111) planes are used to grow III-N epitaxial materials. Silicon (111) has lower mismatch with GaN as compared with Si (100). The hexagonal unit cell provides symmetry thus aiding in better crystal registry of the hexagonal GaN on top of the (111) silicon. High voltage IC's with select sensors utilizing non-Silicon CMOS, as well as RF filters and RF switch applications are enabled, which may operate above about 31.8 GHz, for example.

Figure 2:
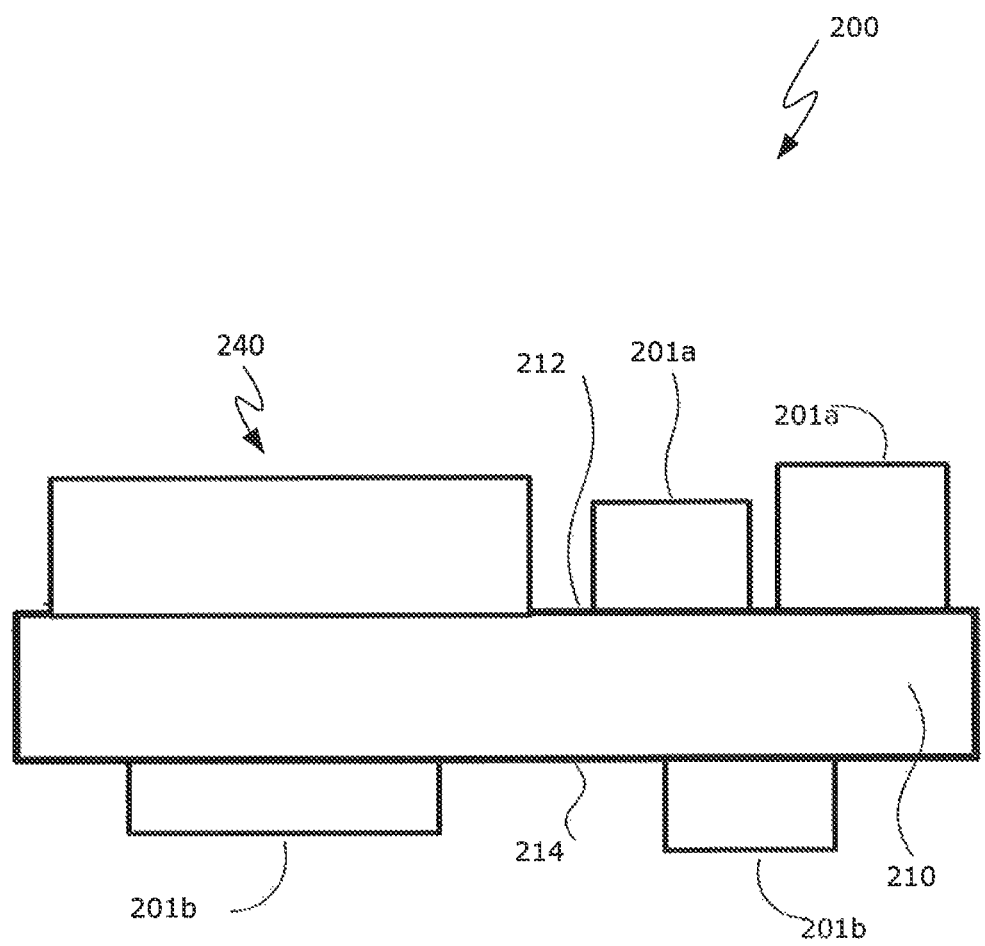
FIG. 2 represents a cross-sectional view of a structure according to embodiments.

Turning back to FIG. 2, illustrated is an embodiment of a computing system 200. The system 200 includes a number of components disposed on a mainboard 210 or other circuit board. Mainboard 210 includes a first side 212 and an opposing second side 214, and various components may be disposed on either one or both of the first and second sides 212, 214. In the illustrated embodiment, the computing system 200 includes a package structure 240 disposed on the mainboard's first side 212, wherein the package structure 240 may comprise any of the device structure embodiments described herein.

System 200 may comprise any type of computing system, such as, for example, a hand-held or mobile computing device (e.g., a cell phone, a smart phone, a mobile internet device, a music player, a tablet computer, a laptop computer, a nettop computer, etc). However, the disclosed embodiments are not limited to hand-held and other mobile computing devices and these embodiments may find application in other types of computing systems, such as desk-top computers and servers.

Mainboard 210 may comprise any suitable type of circuit board or other substrate capable of providing electrical communication between one or more of the various components disposed on the board. In one embodiment, for example, the mainboard 210 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 210. However, it should be understood that the disclosed embodiments are not limited to the above-described PCB and, further, that mainboard 210 may comprise any other suitable substrate.

In addition to the package structure 240, one or more additional components may be disposed on either one or both sides 212, 214 of the mainboard 210. By way of example, as shown in the figures, components 201a may be disposed on the first side 212 of the mainboard 210, and components 201b may be disposed on the mainboard's opposing side 214. Additional components that may be disposed on the mainboard 210 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 200 includes a radiation shield. In a further embodiment, the computing system 200 includes a cooling solution. In yet another embodiment, the computing system 200 includes an antenna. In yet a further embodiment, the assembly 200 may be disposed within a housing or case. Where the mainboard 210 is disposed within a housing, some of the components of computer system 200—e.g., a user interface device, such as a display or keypad, and/or a power supply, such as a battery may be electrically coupled with the mainboard 210 (and/or a component disposed on this board) but may be mechanically coupled with the housing.

Figure 3:
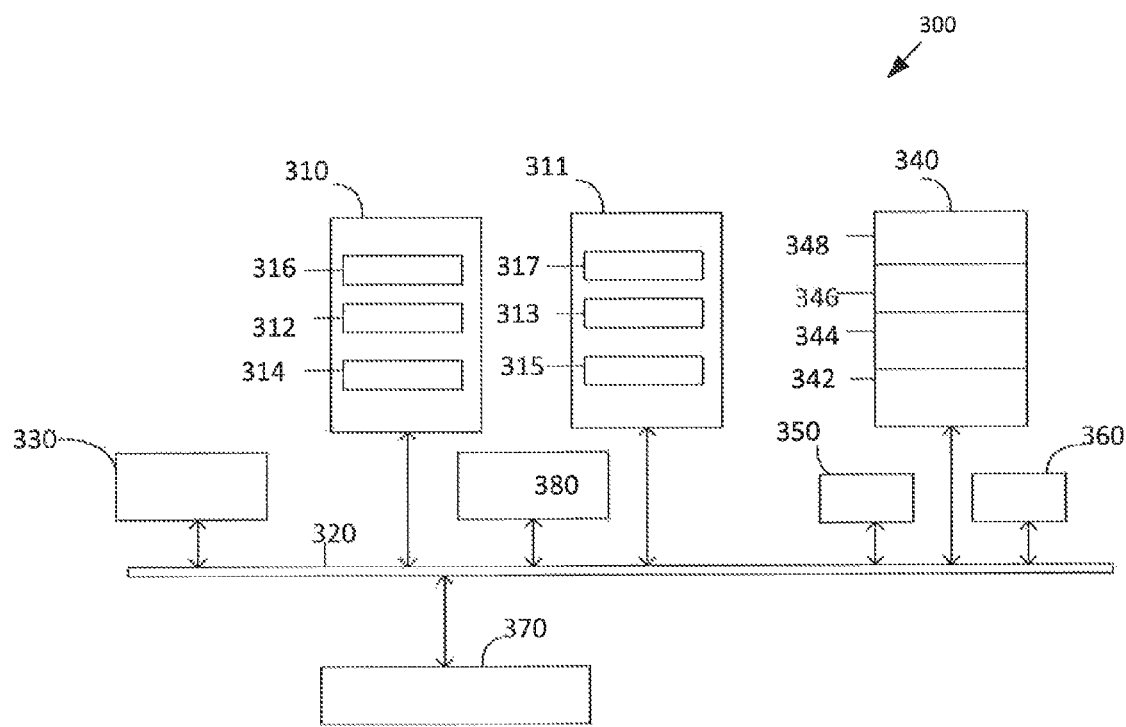
FIG. 3 represents a schematic of a system according to embodiments.

FIG. 3 is a schematic of a computer system 300 according to an embodiment. The computer system 300 (also referred to as the electronic system 300) as depicted can embody/include a device structure that includes any of the several disclosed embodiments and their equivalents as set forth in this disclosure. The computer system 300 may be a mobile device such as a netbook computer. The computer system 300 may be a mobile device such as a wireless smart phone. The computer system 300 may be a desktop computer. The computer system 300 may be a hand-held reader. The computer system 300 may be integral to an automobile. The computer system 300 may be integral to a television.

In an embodiment, the electronic system 300 is a computer system that includes a system bus 320 to electrically couple the various components of the electronic system 300. The system bus 320 is a single bus or any combination of busses according to various embodiments. The electronic system 300 includes a voltage source 330 that provides power to the integrated circuit 310. In some embodiments, the voltage source 330 supplies current to the integrated circuit 310 through the system bus 320.

The integrated circuit 310 is electrically, communicatively coupled to the system bus 320 and includes any circuit, or combination of circuits according to an embodiment, including the package/device of the various embodiments included herein. In an embodiment, the integrated circuit 310 includes a processor 312 that can include any type of packaging structures according to the embodiments herein. As used herein the processor 312 may mean any type of circuit such as, but not limited to, a microprocessor, a microcontroller, a graphics processor, a digital signal processor, or another processor. In an embodiment, the processor 312 includes any of the embodiments of the package structures disclosed herein. In an embodiment, SRAM embodiments are found in memory caches of the processor.

Other types of circuits that can be included in the integrated circuit 310 are a custom circuit or an application-specific integrated circuit (ASIC), such as a communications circuit 314 for use in wireless devices such as cellular telephones, smart phones, pagers, portable computers, two-way radios, and similar electronic systems. In an embodiment, the processor 312 includes on-die memory 316 such as static random-access memory (SRAM). In an embodiment, the processor 312 includes embedded on-die memory 316 such as embedded dynamic random-access memory (eDRAM).

In an embodiment, the integrated circuit 310 is complemented with a subsequent integrated circuit 311. In an embodiment, the dual integrated circuit 311 includes embedded on-die memory 317 such as eDRAM. The dual integrated circuit 311 includes an RFIC dual processor 313 and a dual communications circuit 315 and dual on-die memory 317 such as SRAM. The dual communications circuit 315 may be configured to RF processing.

At least one passive device 380 is coupled to the subsequent integrated circuit 311. In an embodiment, the electronic system 300 also includes an external memory 340 that in turn may include one or more memory elements suitable to the particular application, such as a main memory 342 in the form of RAM, one or more hard drives 344, and/or one or more drives that handle removable media 346, such as diskettes, compact disks (CDs), digital variable disks (DVDs), flash memory drives, and other removable media known in the art. The external memory 340 may also be embedded memory 348. In an embodiment, the electronic system 300 also includes a display device 350, and an audio output 360. In an embodiment, the electronic system 300 includes an input device such as a controller 370 that may be a keyboard, mouse, touch pad, keypad, trackball, game controller, microphone, voice-recognition device, or any other input device that inputs information into the electronic system 300. In an embodiment, an input device 370 includes a camera. In an embodiment, an input device 370 includes a digital sound recorder. In an embodiment, an input device 370 includes a camera and a digital sound recorder.

Although the foregoing description has specified certain steps and materials that may be used in the methods of the embodiments, those skilled in the an will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplar microelectronic devices and associated package structures that pertain to the practice of the embodiments. Thus the embodiments are not limited to the structures described herein.

What is claimed is:
1. A method of forming a device structure comprising:
   forming a III-V device layer on a (111) surface of a silicon fin structure, wherein the silicon fin structure is disposed on a (100) silicon substrate;
   forming a polarizing layer on the III-V device layer;

forming a source/drain material on a portion of the III-V device layer, wherein the source/drain material forms on terminal ends of the silicon fin;

removing a middle portion of the silicon fin structure;

forming a gate dielectric material on the III-V device layer in the gate region; and forming a gate material on the gate dielectric material.

2. The method of claim 1 wherein the source/drain material comprises a hexagonal plane crystal structure.

3. The method of claim 1 further comprising wherein the silicon fin is p doped and comprises a V structure.

4. The method of claim 1 further comprising wherein a spacer layer is formed on the substrate surface and on the silicon fin sidewalls prior to forming the III-V device layer.

5. The method of claim 1 further comprising wherein the III-V device layer comprises a gallium nitride epitaxial layer.

6. The method of claim 1 further comprising wherein a top portion of the III-V device layer is planarized.

7. The method of claim 1 further comprising wherein the polarization layer comprises one of an aluminum gallium nitride or an aluminum indium nitride.

8. The method of claim 1 further comprising wherein the middle portion of the silicon fin is removed under a gate region of the III-V device layer, wherein a low k dielectric is used to back fill the region.

9. The method of claim 1 further comprising forming a nucleation layer between the device layer and the (111) plane of the silicon.

10. The method of claim 1 further comprising wherein the silicon fin comprises an M structure.

11. The method of claim 1 further comprising wherein the device structure comprises a portion of one of a multi-gate and a nanowire transistor structure.

12. A method of forming a transistor structure comprising:

forming a III-V device layer on (111) surface of a silicon fin structure, wherein the silicon fin structure is disposed on a (100) silicon substrate;

forming a polarizing layer on the III-V device layer, wherein the polarizing layer comprises a two dimensional electron gas; and forming a source/drain structure on a portion of the III-V device layer, wherein the source/drain material forms on terminal ends of the silicon fin, and wherein the source/drain material comprises a hexagonal crystal plane structure.

13. The method of claim 12 further comprising removing a middle portion of the silicon fin structure and filling it with a dielectric material.

14. The method of claim 12 further comprising forming a gate dielectric material on the III-V device layer in a gate region.

15. The method of claim 14 further comprising forming a gate material on the gate dielectric material.

16. A device structure comprising:

a III-V device layer disposed on a (111) surface of a silicon fin structure, wherein the silicon fin structure is disposed on a (100) silicon substrate;

a polarizing layer disposed on the III-V device layer;

a source/drain material disposed on a portion of the III-V device layer, wherein the source/drain material forms on terminal ends of the silicon fin and comprises a hexagonal crystalline structure.

17. The structure of claim 16 further comprising wherein the silicon fin is p doped and comprises one of a V structure and an M structure.

18. The structure of claim 16 further comprising wherein a spacer layer of dielectric material is disposed on a surface of the substrate and on sidewalls of the silicon fin.

19. The structure of claim 16 further comprising wherein the III-V device layer comprises a gallium nitride layer, and extends in a downward direction towards the substrate, and wherein the III-V device layer is substantially defect free.

20. The structure of claim 16 further comprising wherein a nucleation layer is disposed between the (111) silicon fin surface and the III-V device layer.

21. The structure of claim 16 further comprising wherein the polarization layer comprises one of aluminum gallium nitride or aluminum indium nitride.

22. The structure of claim 16 further comprising wherein the silicon fin comprises a first portion disposed under the source material and a second portion disposed under the drain material, wherein an oxide layer is disposed between the first and second portions, and wherein no silicon is disposed between the first and second portions of the silicon fin.

23. The structure of claim 16 further comprising a gate dielectric material disposed on the III-V device layer in a gate region, wherein the gate dielectric material comprises one of a HfO2, Al2O3, and other hi k materials, and is formed by ALD.

24. The structure of claim 23 further comprising wherein a gate material is disposed on the gate dielectric material, wherein the gate material comprises at least one of nickel, platinum, titanium nitride.

25. The device structure of claim 16 further comprising a system
comprising:
a bus communicatively coupled to the device structure; and
an eDRAM communicatively coupled to the bus.

* * * * *